US012756182B2

(12) United States Patent
Wang et al.

(10) Patent No.: US 12,756,182 B2
(45) Date of Patent: Oct. 6, 2026

(54) INTEGRATED CIRCUIT

(71) Applicant: VIA LABS, INC., New Taipei City (TW)

(72) Inventors: Wei-Yu Wang, New Taipei City (TW); Yu-Chung Wei, New Taipei City (TW)

(73) Assignee: VIA LABS, INC., New Taipei City (TW)

( * ) Notice: Subject to any disclaimer, the term of this patent is extended or adjusted under 35 U.S.C. 154(b) by 211 days.

(21) Appl. No.: 18/673,253

(22) Filed: May 23, 2024

(65) Prior Publication Data

US 2025/0167544 A1 May 22, 2025

(30) Foreign Application Priority Data

Nov. 21, 2023 (TW) ................................ 112144984

(51) Int. Cl.
*H02H 9/04* (2006.01)
*H10D 84/83* (2025.01)

(52) U.S. Cl.
CPC ............. *H02H 9/046* (2013.01); *H10D 84/83* (2025.01)

(58) Field of Classification Search
CPC ...................................................... H02H 9/046
See application file for complete search history.

(56) References Cited

U.S. PATENT DOCUMENTS

2004/0061554 A1* 4/2004 Kajiwara ............. H03G 3/3042 330/133
2005/0122644 A1* 6/2005 Ma ....................... H10D 89/711 361/56
2010/0103571 A1* 4/2010 Brown, Jr. ............. H10D 89/60 361/56
2010/0140659 A1* 6/2010 Ker ...................... H10D 89/713 257/E29.211
2013/0127539 A1* 5/2013 Murakami ............. H10D 84/85 257/350
2014/0171010 A1* 6/2014 Olson .................... H10D 84/83 438/59
2020/0286882 A1 9/2020 Kohama

FOREIGN PATENT DOCUMENTS

| | | |
|---|---|---|
| CN | 113206076 | 8/2021 |
| CN | 114430269 | 5/2022 |
| TW | I615699 | 2/2018 |
| TW | I692942 | 5/2020 |

OTHER PUBLICATIONS

"Office Action of Taiwan Counterpart Application", issued on Jun. 17, 2024, p. 1-p. 5.

* cited by examiner

*Primary Examiner* — Scott Bauer
(74) *Attorney, Agent, or Firm* — JCIPRNET

(57) ABSTRACT

An integrated circuit including a signal connection pad, an electrostatic discharge (ESD) protection circuit, and an input stage circuit is provided. The ESD protection circuit is coupled to the signal connection pad. An input terminal of the input stage circuit is coupled to the ESD protection circuit. The input stage circuit includes a load circuit, a current source circuit, an input transistor, and an impedance circuit. A control terminal of the input transistor is coupled to the ESD protection circuit. A first terminal of the input transistor is coupled to the load circuit. A second terminal of the input transistor is coupled to the current source circuit. A first terminal of the impedance circuit is coupled to a body of the input transistor. A second terminal of the impedance circuit is coupled to a first voltage.

15 Claims, 11 Drawing Sheets

INTEGRATED CIRCUIT

CROSS-REFERENCE TO RELATED APPLICATION

This application claims the priority benefit of Taiwan application serial no. 112144984, filed on Nov. 21, 2023. The entirety of the above-mentioned patent application is hereby incorporated by reference herein and made a part of this specification.

BACKGROUND

Technical Field

The disclosure relates to an electronic circuit, and particularly relates to an input stage circuit in an integrated circuit.

Description of Related Art

Static electricity is everywhere. When a component encounters a voltage or current that exceeds its load capacity, the component may easily burn out. Generally, a bonding pad (or connecting pad) of an integrated circuit has an electrostatic discharge (ESD) protection circuit. When an ESD event occurs on the bonding pad, the ESD protection circuit located on the bonding pad may opportunely guide an ESD current to a reference voltage rail to prevent an ESD voltage or current from damaging a core circuit, for example, an input stage circuit. Generally, a substrate of the integrated circuit is electrically connected to the reference voltage rail. When an ESD event occurs, the substrate of the integrated circuit is often one of transmission paths for the ESD current.

The conventional input stage circuit has a differential pair composed of two N-type metal-oxide-semiconductor (NMOS) transistors. In an advanced process (such as a 28 nm process), since a gate gap of a transistor becomes thinner, an ESD tolerance of the conventional input stage circuit becomes weaker. Namely, the ESD tolerance of the conventional input stage circuit is usually the weakest point of the entire integrated circuit. In order to improve the ESD tolerance of the conventional input stage circuit, an additional ESD protection resistor or other additional secondary ESD protection circuit is usually added in a signal path between an input terminal of the input stage circuit and a signal bonding pad. However, the conventional secondary ESD protection circuit may reduce a signal input performance of the integrated circuit. Therefore, the circuit design of the conventional input stage circuit may fall into a trade-off between “ESD tolerance” and “performance”. Higher ESD tolerance may result in lower performance, or higher performance may result in lower ESD tolerance.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure was acknowledged by a person of ordinary skill in the art.

SUMMARY

The disclosure is directed to an integrated circuit, which is adapted to improve an electrostatic discharge (ESD) tolerance of an input stage circuit without compromising a normal operating performance.

In an embodiment of the disclosure, the integrated circuit includes a signal connection pad, an electrostatic discharge (ESD) protection circuit, and an input stage circuit. The ESD protection circuit is coupled to the signal connection pad. A first input terminal of the input stage circuit is coupled to the ESD protection circuit. The input stage circuit includes a load circuit, a current source circuit, a first input transistor, and an impedance circuit. A control terminal of the first input transistor is coupled to the ESD protection circuit. A first terminal of the first input transistor is coupled to the load circuit. A second terminal of the first input transistor is coupled to the current source circuit. A first terminal of the impedance circuit is coupled to a body of the first input transistor. A second terminal of the impedance circuit is coupled to a first voltage.

Based on the above, the impedance circuit described in the embodiment of the disclosure is coupled between the body of the first input transistor and the first voltage. In some embodiments, the impedance circuit is coupled to the first voltage (for example, a reference voltage VSS) through a substrate of the integrated circuit. During a normal operation of the integrated circuit, the impedance circuit isolates a substrate noise. When an ESD event occurs, the impedance circuit prevents ESD charges from the substrate from entering the body of the first input transistor. Therefore, the ESD tolerance of the input stage circuit may be effectively improved without compromising the normal operating performance.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
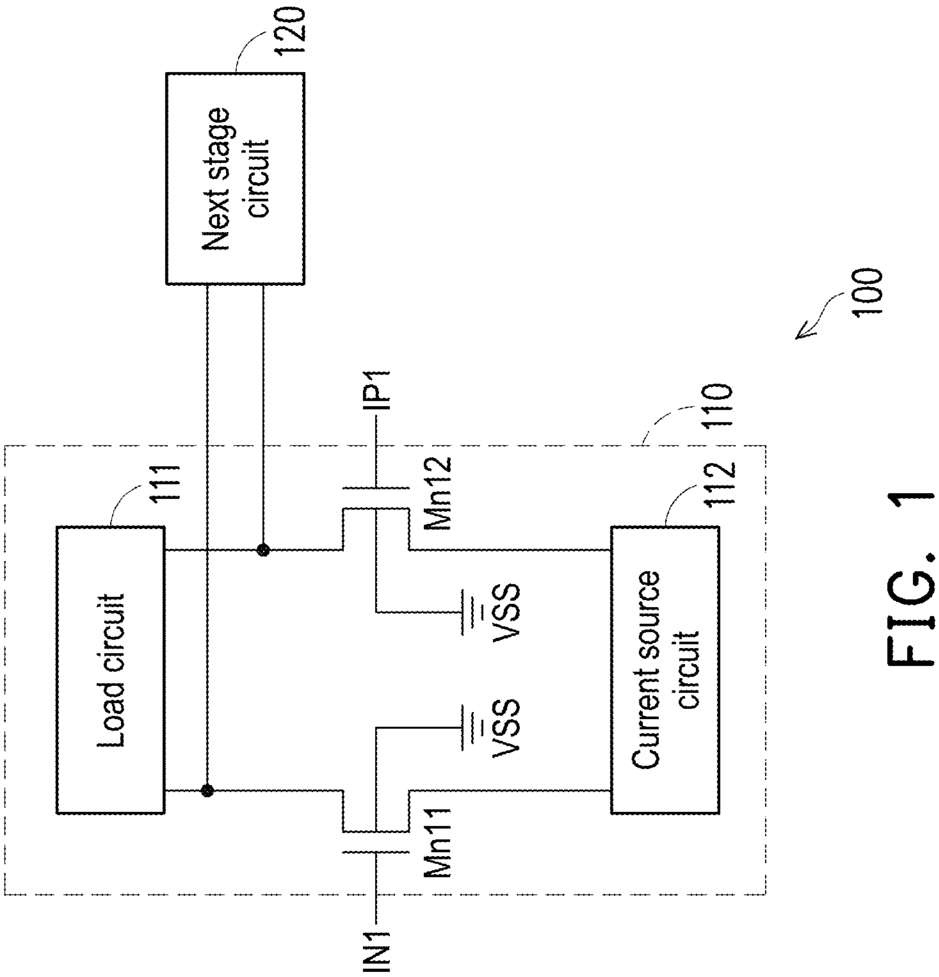
FIG. 1 is a schematic circuit block diagram of an input stage circuit in an integrated circuit according to an embodiment.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. The terms "first" and "second" mentioned in the full text of the specification (including the claims) are used to name elements or to distinguish different embodiments or scopes, and are not used to limit an upper limit or a lower limit of the number of elements, nor are they used to limit an order of the elements. Moreover, wherever possible, elements/members/steps using the same referential numbers in the drawings and description refer to the same or like parts. Elements/members/steps using the same referential numbers or using the same terms in different embodiments may cross-refer related descriptions.

FIG. 1 is a schematic circuit block diagram of an input stage circuit 110 in an integrated circuit 100 according to an embodiment. Differential input terminals IN1 and IP1 of the input stage circuit 110 are coupled to an input signal bonding pad (not shown in FIG. 1) of the integrated circuit 100. Based on input signals of the differential input terminals IN1 and IP1, the input stage circuit 110 may generate a processed input signal to a next stage circuit 120. Based on an actual design, the next stage circuit 120 may include a gain stage and/or other functional circuits. The input stage circuit 110 shown in FIG. 1 has an N-type metal-oxide-semiconductor (NMOS) transistor Mn11, an NMOS transistor Mn12, a load circuit 111 and a current source circuit 112. The NMOS transistor Mn11 and the NMOS transistor Mn12 form a differential pair of the input stage circuit 110. The differential pair Mn11 and Mn12 is respectively coupled between the load circuit 111 and the current source circuit 112.

Generally, bodies of the NMOS transistors Mn11 and Mn12 are directly electrically connected to a substrate of the integrated circuit 100, and the substrate of the integrated circuit 100 is coupled to a reference voltage VSS (for example, a ground voltage or other fixed voltage). Under an advanced manufacturing process (such as a 28 nM manufacturing process), since a gate gap of the NMOS transistors Mn11 and Mn12 becomes thinner, the electrostatic discharge (ESD) tolerance of the input stage circuit 110 becomes weaker. Therefore, the ESD tolerance of the input stage circuit 110 is generally the weakest point of the entire integrated circuit 100.

Figure 2:
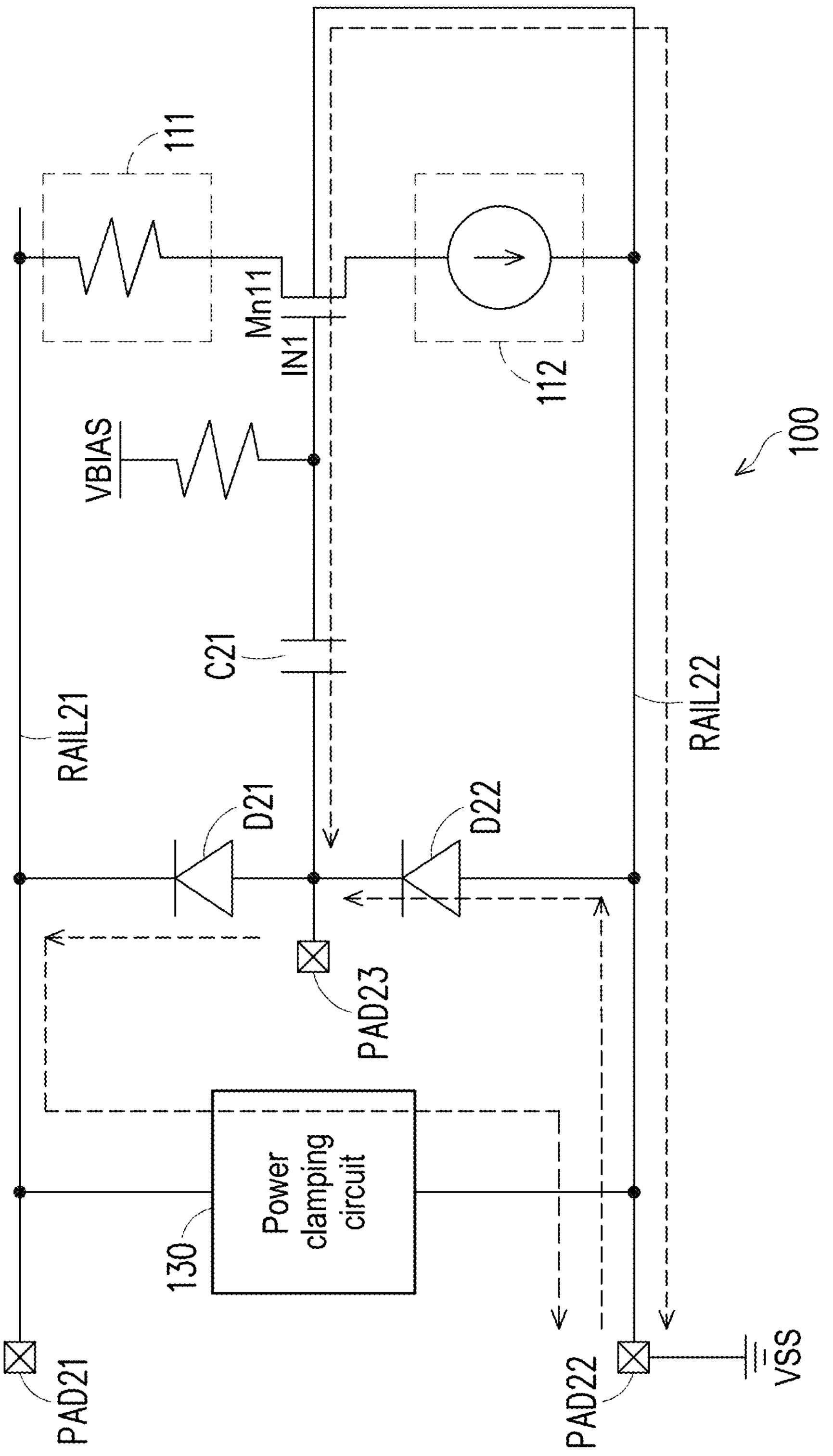
FIG. 2 is a schematic diagram illustrating a flow path of an ESD current in an integrated circuit when an ESD event occurs according to an embodiment.

FIG. 2 is a schematic diagram illustrating a flow path of an ESD current in the integrated circuit 100 when an ESD event occurs according to an embodiment. The load circuit 111 and the current source circuit 112 shown in FIG. 2 may be used as one of many implementation examples of the load circuit 111 and the current source circuit 112 shown in FIG. 1. The NMOS transistor Mn11 and the input terminal IN1 shown in FIG. 1 are illustrated in FIG. 2. For the NMOS transistor Mn12 and the input terminal IP1 shown in FIG. 1, reference may be made to the relevant description of the NMOS transistor Mn11 and the input terminal IN1 shown in FIG. 2 and make analogies.

In the example shown in FIG. 2, a power rail RAIL21 may transmit a power voltage (for example, a system voltage VDD) of a power connection pad PAD21 to different components/circuits in the integrated circuit 100. Similarly, a power rail RAIL22 may transmit a power voltage (for example, the reference voltage VSS) of a power connection pad PAD22 to different components/circuits in the integrated circuit 100. A signal connection pad PAD23 may transmit an input signal to the input terminal IN1 of the input stage circuit 110 (a gate of the NMOS transistor Mn11) through an AC coupling capacitor C21. VBIAS shown in FIG. 2 represents a bias voltage, and a specific voltage level thereof may be determined based on an actual design. In different embodiments, the power connection pad PAD21, the power connection pad PAD22 and/or the signal connection pad PAD23 may be bonding pads or other types of connection pads.

The integrated circuit 100 has an ESD protection circuit, such as a power clamping circuit 130, a diode D21 and a diode D22. It is assumed here that the power connection pad PAD22 has been coupled to the reference voltage VSS (voltage source). When an ESD event with a negative pulse occurs on the signal connection pad PAD23, the ESD current flows from the power connection pad PAD22 and flows through the power rail RAIL22 and the diode D22 to reach the signal connection pad PAD23. In addition, since the gate gap of the NMOS transistor Mn11 is quite thin, the ESD current may also probably flow from the power connection pad PAD22 and flow through the power rail RAIL22, the substrate of the integrated circuit 100 (the body of the NMOS transistor Mn11), the input terminal IN1 (the gate of the NMOS transistor Mn11) and the AC coupling capacitor C21 to reach the signal connection pad PAD23. The huge ESD energy may probably damage the NMOS transistor Mn11 (for example, breakdown the gate of the NMOS transistor Mn11).

The embodiment does not limit the implementation of the power clamping circuit 130. For example, in some embodiments, the power clamping circuit 130 may be a well-known ESD power clamping circuit or other power clamping circuits. When an ESD event with a positive pulse occurs on the signal connection pad PAD23, the ESD current flows from the signal connection pad PAD23 and flows through the diode D21, the power rail RAIL21, the power clamping circuit 130 and the power rail RAIL22 to reach the power connect pad PAD22. In addition, the ESD current may also flow from the signal connection pad PAD23 and flow through the AC coupling capacitor C21, the input terminal IN1 (the gate of the NMOS transistor Mn11), the substrate of the integrated circuit 100 (the body of the NMOS transistor Mn11) and the power rail RAIL22 to reach the power connection pad PAD22. At this time, the huge ESD energy may probably damage the NMOS transistor Mn11.

Figure 3:
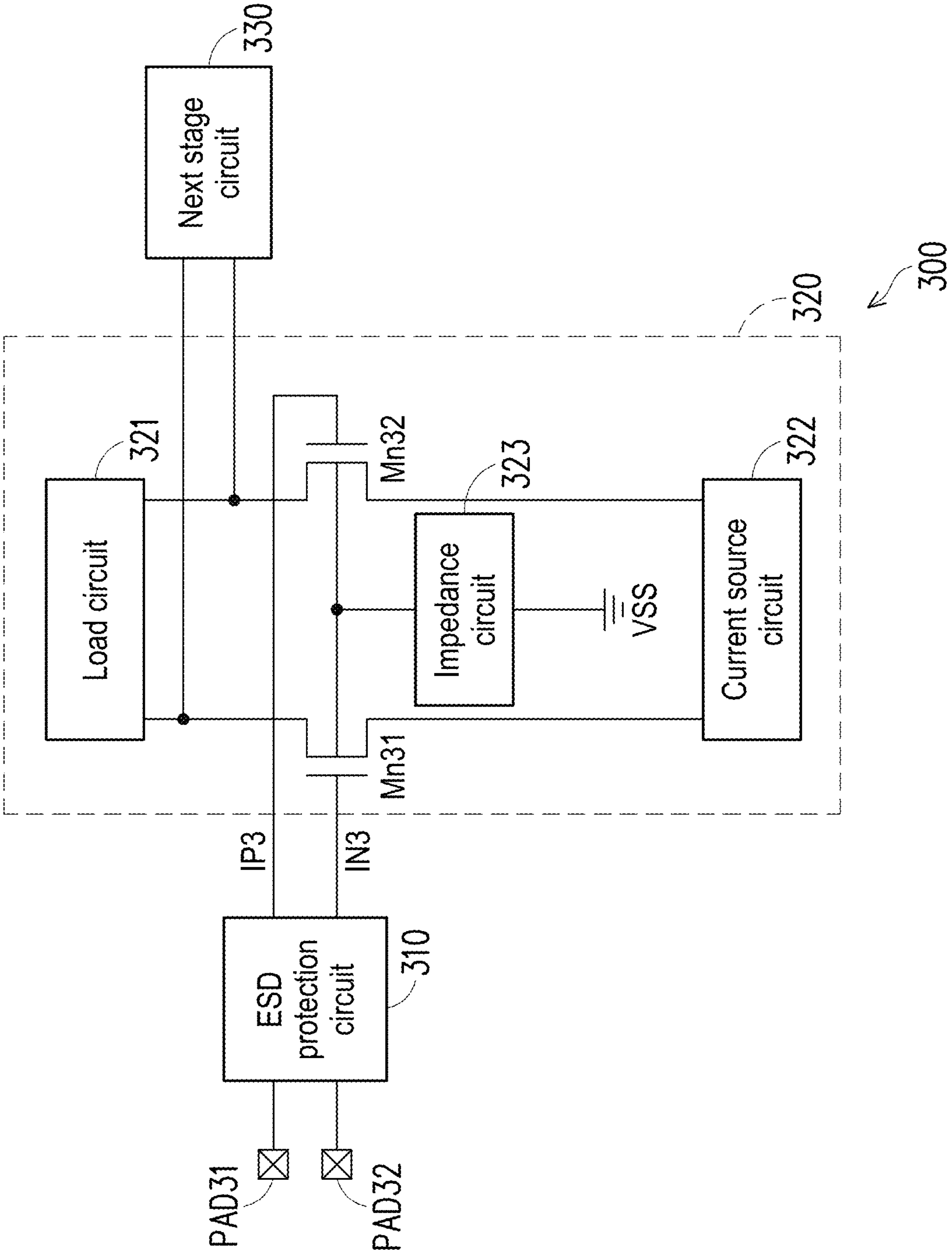
FIG. 3 is a schematic circuit block diagram of an integrated circuit according to an embodiment of the disclosure.

FIG. 3 is a schematic circuit block diagram of an integrated circuit 300 according to an embodiment of the disclosure. The integrated circuit 300 shown in FIG. 3 includes a signal connection pad PAD31, a signal connection pad PAD32, an ESD protection circuit 310, and an input stage circuit 320. In different embodiments, the signal connection pads PAD31 and/or PAD32 may be bonding pads or other types of connection pads. The ESD protection circuit 310 is coupled to the signal connection pads PAD31 and PAD32. Differential input terminals IN3 and IP3 of the input stage circuit 320 are coupled to the ESD protection circuit 310. Based on the input signals of the differential input terminals IN3 and IP3, the input stage circuit 320 may generate a processed input signal to a next stage circuit 330. Based on an actual design, the next stage circuit 330 may include a gain stage and/or other functional circuits.

Figure 4:
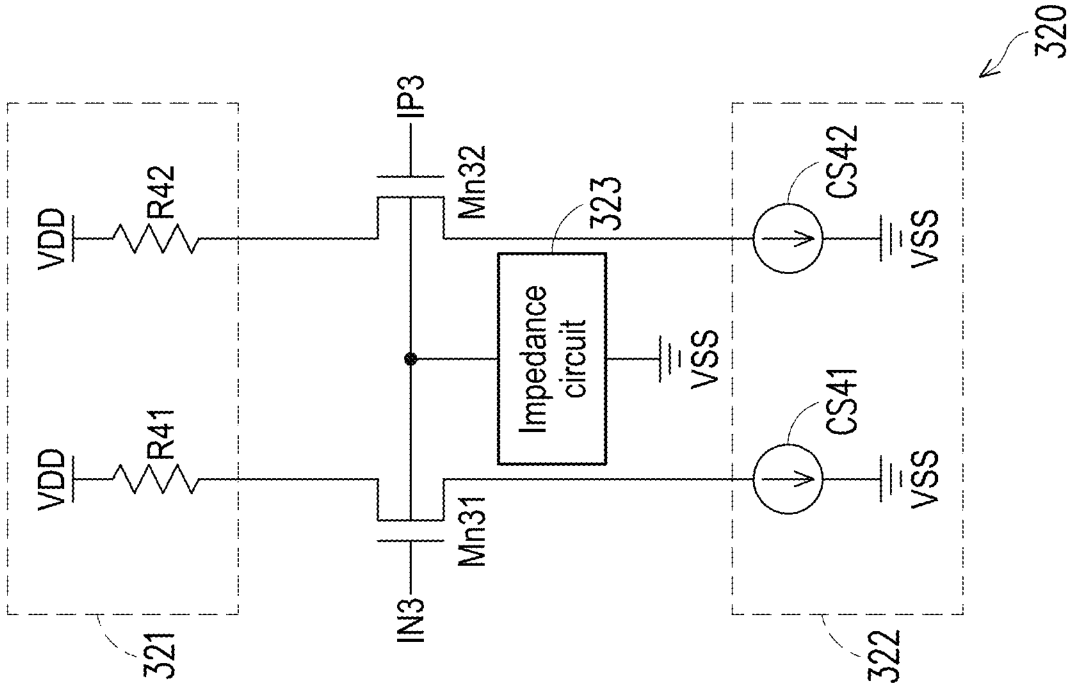
FIG. 4 is a schematic circuit block diagram of an input stage circuit according to an embodiment of the disclosure.

FIG. 4 is a schematic circuit block diagram of the input stage circuit 320 according to an embodiment of the disclosure. In the embodiment shown in FIG. 3 and FIG. 4, the input stage circuit 320 includes a load circuit 321, a current source circuit 322, an input transistor Mn31, an input transistor Mn32, and an impedance circuit 323. The input transistors Mn31 and Mn32 are an input transistor pair of the input stage circuit 320. The input transistors Mn31 and Mn32 shown in FIG. 3 and FIG. 4 are N-type transistors, such as NMOS transistors. However, the implementation of the input transistors Mn31 and Mn32 in other examples is not limited thereto. Control terminals (for example, gates) of the input transistors Mn31 and Mn32 are respectively used as the differential input terminals IN3 and IP3 of the input stage circuit 320 for coupling to the ESD protection circuit 310. First terminals (for example, drains) of the input transistors Mn31 and Mn32 are coupled to the load circuit 321. Second terminals (for example, sources) of the input transistors Mn31 and Mn32 are coupled to the current source circuit 322.

In the embodiment shown in FIG. 4, the load circuit 321 includes a resistor R41 and a resistor R42, and the current source circuit 322 includes a current source CS41 and a current source CS42. First terminals of the resistors R41 and R42 are coupled to a second voltage, such as the system voltage VDD or other fixed voltages. A level of the system voltage VDD may be determined based on an actual application. A second terminal of the resistor R41 is coupled to a first terminal of the input transistor Mn31 and coupled to the next stage circuit 330. The current source CS41 is coupled to a second terminal of the input transistor Mn31. A second terminal of the resistor R42 is coupled to a first terminal of the input transistor Mn32 and coupled to the next stage circuit 330. The current source CS42 is coupled to a second terminal of the input transistor Mn32.

Referring to FIG. 3, a first terminal of the impedance circuit 323 is coupled to the bodies of the input transistors Mn31 and Mn32. A second terminal of the impedance circuit 323 is coupled to a first voltage. The first voltage may be determined according to an actual design. For example, in the embodiment shown in FIG. 3, the second terminal of the impedance circuit 323 may be directly electrically connected to the substrate of the integrated circuit 300, and the substrate of the integrated circuit 300 is coupled to the first voltage. Where, based on the actual design, the first voltage may be the reference voltage VSS (for example, ground voltage) or other fixed voltages. A level of the reference voltage VSS may be determined based on actual applications.

Figure 5:
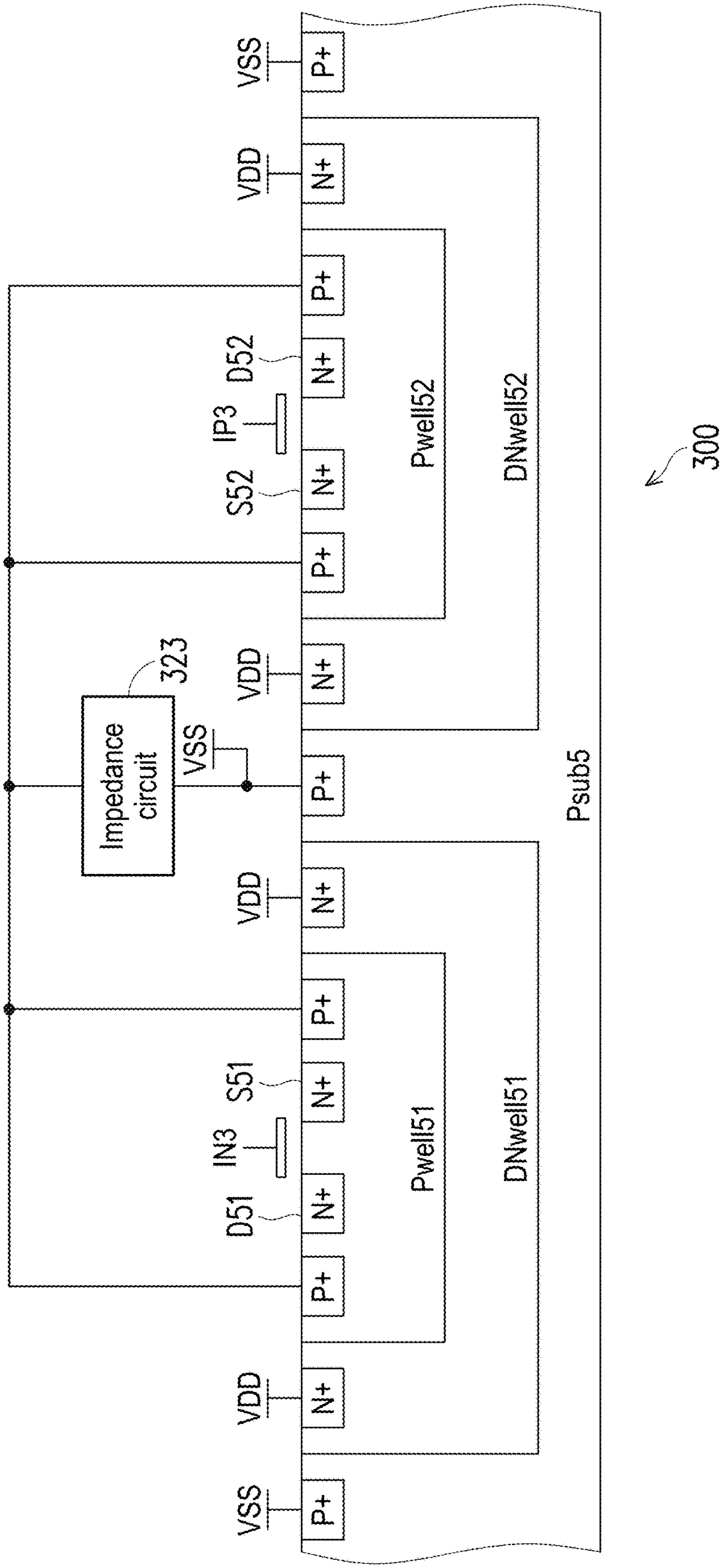
FIG. 5 is a schematic cross-sectional view of input transistors according to an embodiment of the disclosure.

FIG. 5 is a schematic cross-sectional view of input transistors Mn31 and Mn32 according to an embodiment of the disclosure. The layout structure shown in FIG. 5 may be one of many layout structure examples of the input transistors Mn31 and Mn32 shown in FIG. 3. Referring to FIG. 3 and FIG. 5, the substrate of the integrated circuit 300 is a first type substrate (for example, P-type substrate) Psub5. A second type deep wells (for example, N-type deep wells) DNwell51 and DNwell52 of the integrated circuit 300 are configured in the substrate Psub5. A first type well (for example, a P-type well) Pwell51 of the integrated circuit 300 is configured in the deep well DNwell51. The deep well DNwell51 isolates the well Pwell51 (the body of the input transistor Mn31) from the substrate Psub5. Another first type well (for example, P-type well) Pwell52 of the integrated circuit 300 is configured in the deep well DNwell52. The deep well DNwell52 isolates the well Pwell52 (the body of the input transistor Mn32) from the substrate Psub5.

The input transistor Mn31 is configured in the well Pwell51, where N+ doped regions D51 and S51 may respectively serve as the first terminal and the second terminal (drain and source) of the input transistor Mn31. One of the N+ doped regions D51 and S51 is coupled to the load circuit 321, and the other one of the N+ doped regions D51 and S51 is coupled to the current source circuit 322. The input transistor Mn32 is configured in the well Pwell52, where N+ doped regions D52 and S52 may respectively serve as the first terminal and the second terminal (drain and source) of the input transistor Mn32. One of the N+ doped regions D52 and S52 is coupled to the load circuit 321, and the other one of the N+ doped regions D52 and S52 is coupled to the current source circuit 322. The differential input terminals IN3 and IP3 are coupled to the ESD protection circuit 310. The first terminal of the impedance circuit 323 is coupled to the well Pwell51 (the body of the input transistor Mn31) and the well Pwell52 (the body of the input transistor Mn32). The second terminal of the impedance circuit 323 is directly electrically connected to the substrate Psub5 of the integrated circuit 300, and the substrate Psub5 is coupled to the reference voltage VSS.

The embodiment does not limit the implementation of the impedance circuit 323. For example, in different embodiments, the impedance circuit 323 may be implemented by active components such as NMOS, PMOS, or a bipolar junction transistor (BJT). Alternatively, the following FIG. 6 and FIG. 7 show different implementations of the impedance circuit 323.

Figure 6:
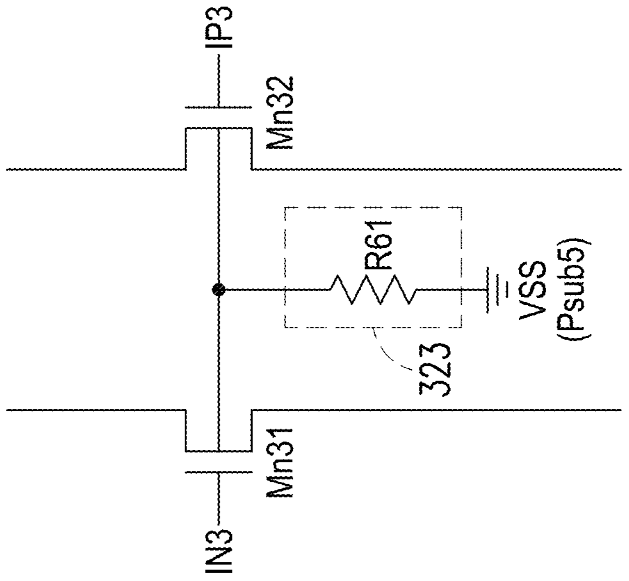
FIG. 6 is a schematic circuit block diagram of an impedance circuit according to an embodiment of the disclosure.

FIG. 6 is a schematic circuit block diagram of the impedance circuit 323 according to an embodiment of the disclosure. The impedance circuit 323 shown in FIG. 6 may be one of many implementation examples of the impedance circuit 323 shown in FIG. 3. In the embodiment shown in FIG. 6, the impedance circuit 323 includes a resistor R61. A first terminal of the resistor R61 is coupled to the bodies (the wells Pwell51 and Pwell52) of the input transistors Mn31 and Mn32. A second terminal of the resistor R61 is directly coupled to the substrate Psub5 (first voltage). An impedance value of the impedance circuit 323 may be determined according to an actual design. For example, in some application examples, the impedance value of the impedance circuit 323 may be any real number between 100 and 10K ohms. In other application examples, the impedance value of the impedance circuit 213 may be any real number between 200 and 300 ohms.

Figure 7:
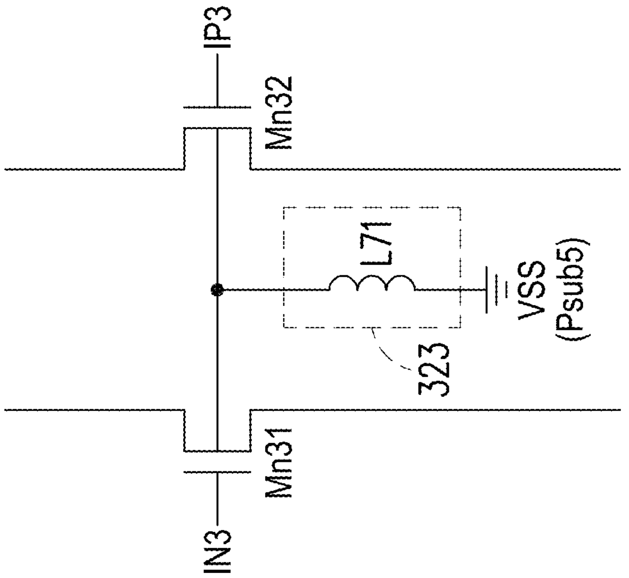
FIG. 7 is a schematic circuit block diagram of an impedance circuit according to another embodiment of the disclosure.

FIG. 7 is a schematic circuit block diagram of the impedance circuit 323 according to another embodiment of the disclosure. The impedance circuit 323 shown in FIG. 7 may be one of many implementation examples of the impedance circuit 323 shown in FIG. 3. In the embodiment shown in FIG. 7, the impedance circuit 323 includes an inductor L71. A first terminal of the inductor L71 is coupled to the bodies (the wells Pwell51 and Pwell52) of the input transistors Mn31 and Mn32. A second terminal of the inductor L71 is directly coupled to the substrate Psub5 (first voltage). An impedance value of the impedance circuit 323 may be determined according to an actual design. For example, in some application examples, a high-frequency equivalent resistance of the inductor L71 may be any real number between 100 and 10K ohms.

Figure 8:
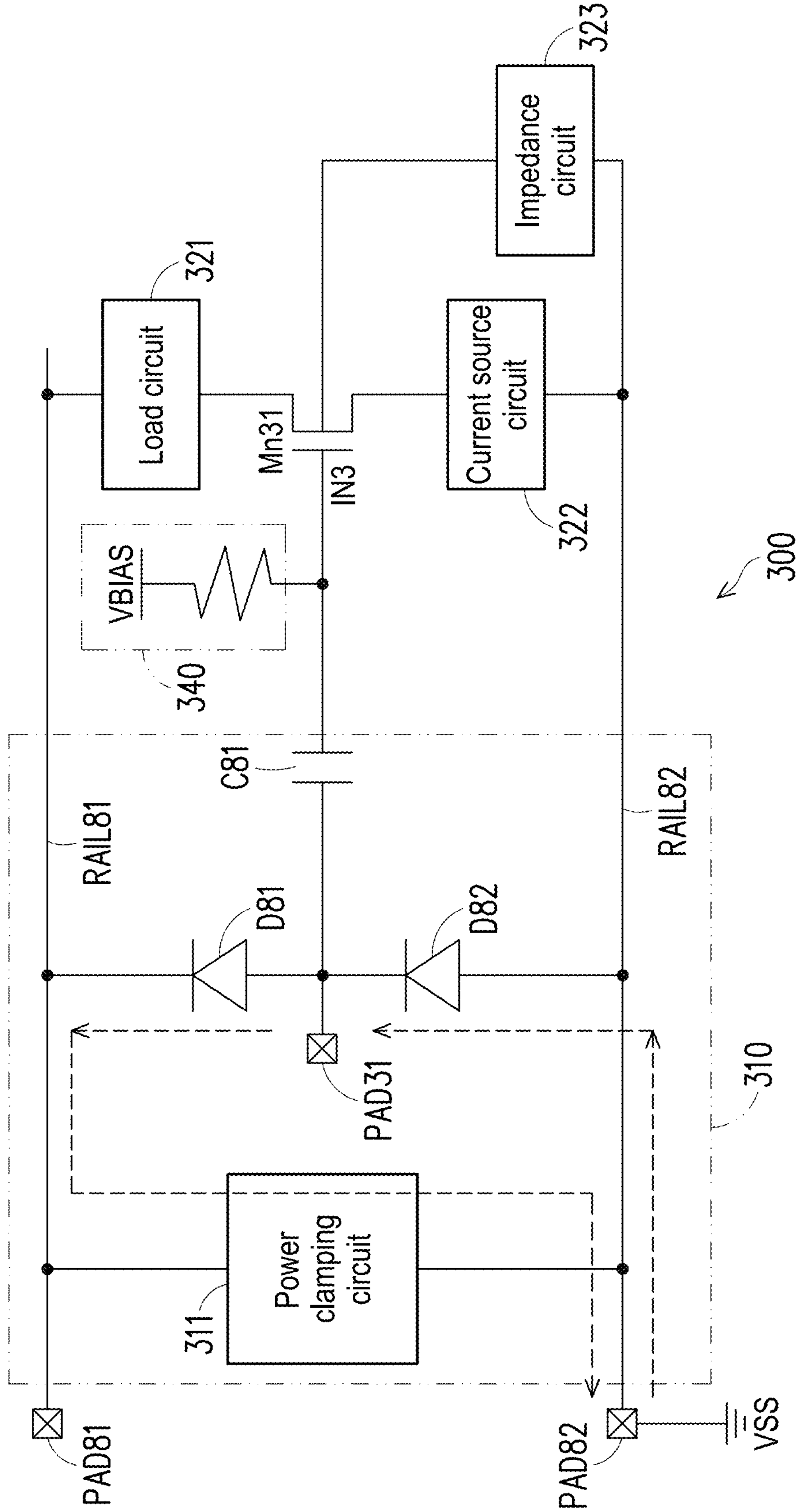
FIG. 8 is a schematic diagram illustrating a flow path of an ESD current in an integrated circuit when an ESD event occurs according to an embodiment of the disclosure.

FIG. 8 is a schematic diagram illustrating a flow path of an ESD current in the integrated circuit 300 when an ESD event occurs according to an embodiment of the disclosure. For the integrated circuit 300, the input transistor Mn31, the load circuit 321, the current source circuit 322, the impedance circuit 323, the input terminal IN3, the signal connection pad PAD31 and the ESD protection circuit 310 shown in FIG. 8, reference may be made to the relevant descriptions of the integrated circuit 300, the input transistor Mn31, the load circuit 321, the current source circuit 322, the impedance circuit 323, the input terminal IN3, the signal connection pad PAD31 and the ESD protection circuit 310 shown in FIG. 3. For the input transistor Mn32 and the input terminal IP3 shown in FIG. 3, reference may be made to the relevant description of the input transistor Mn31 and the input terminal IN3 shown in FIG. 8 and make analogies. In the embodiment shown in FIG. 8, the integrated circuit 300 further includes a bias circuit 340. The bias circuit 340 is coupled to the control terminal of the input transistor Mn31, where VBIAS represents a bias voltage (a specific voltage level thereof may be determined based on the actual design).

In the embodiment shown in FIG. 8, the ESD protection circuit 310 includes a power clamping circuit 311, a diode D81, a diode D82 and an AC coupling capacitor C81. A first terminal (for example, a cathode) of the diode D81 is coupled to a power rail RAIL81 of the integrated circuit 300. A second terminal (for example, an anode) of the diode D81 and a first terminal (for example, a cathode) of the diode D82 are coupled to the signal connection pad PAD31. A second terminal (for example, an anode) of the diode D82 is coupled to a power rail RAIL82 of the integrated circuit 300. The power rail RAIL81 is coupled to a power connection pad PAD81 of the integrated circuit 300. The power rail RAIL81 may transmit a power voltage (for example, the system voltage VDD) of the power connection pad PAD81 to different components/circuits in the integrated circuit 300. The power rail RAIL82 is coupled to a power connection pad PAD82 of the integrated circuit 300. The power rail RAIL82 may transmit a power voltage (for example, the reference voltage VSS) of the power connection pad PAD82 to different components/circuits in the integrated circuit 300.

A first terminal of the AC coupling capacitor C81 is coupled to the signal connection pad PAD31, the second terminal of the diode D81 and the first terminal of the diode D82. A second terminal of the AC coupling capacitor C81 is coupled to the control terminal of the input transistor Mn31. The signal connection pad PAD31 may transmit the input signal to the input terminal IN3 (the control terminal of the input transistor Mn31) of the input stage circuit 320 through the AC coupling capacitor C81.

The embodiment does not limit the implementation of the power clamping circuit 311. For example, in some embodiments, the power clamping circuit 311 may be a well-known ESD power clamping circuit or other power clamping circuits. A first terminal of the power clamping circuit 311 is coupled to the power rail RAIL81 of the integrated circuit 300. A second terminal of the power clamping circuit 311 is coupled to the power rail RAIL82 of the integrated circuit 300. In different embodiments, the power connection pad PAD81 and/or the power connection pad PAD82 may be bonding pads or other types of connection pads.

It is assumed here that the power connection pad PAD82 has been coupled to the reference voltage VSS (a voltage source). When an ESD event with a negative pulse occurs on the signal connection pad PAD31, the ESD current flows from the power connection pad PAD82 and flows through the power rail RAIL82 and the diode D82 to reach the signal connection pad PAD31. When an ESD event with a positive pulse occurs on the signal connection pad PAD31, the ESD current flows from the signal connection pad PAD31 and flows through the diode D81, the power rail RAIL81, the power clamping circuit 311 and the power rail RAIL82 to reach the power connection pad PAD82. Compared to FIG. 2, due to the obstruction of the impedance circuit 323 (and the isolation of the deep well DNwell51 shown in FIG. 5), it is difficult for the ESD current to flow through the power rail RAIL82 (and the substrate Psub5 shown in FIG. 5) to reach the body of the input transistor Mn31 (the well Pwell51 shown in FIG. 5), thereby protecting the input transistor Mn31. Therefore, the impedance circuit 323 (and the deep well DNwell51 shown in FIG. 5) may effectively improve the ESD tolerance of the input stage circuit 320 without compromising the normal operating efficiency of the input stage circuit 320.

In conclusion, since ESD charges on the power rail RAIL82 (and the substrate Psub5) may be prevented from entering the body (the well Pwell51) of the input transistor Mn31 and the body (the well Pwell52) of the input transistor Mn32, the ESD protection effect is better. In addition, during a normal operation of the integrated circuit 300, the impedance circuit 323 may isolate noise of the substrate Psub5 to enhance the performance of the input stage circuit 320. The above embodiment may effectively reduce a common-mode gain but keep a differential gain constant. Therefore, the integrated circuit 300 described in the above embodiment may improve a common-mode rejection ratio (CMRR) to enhance performance of a receiver circuit.

Figure 9:
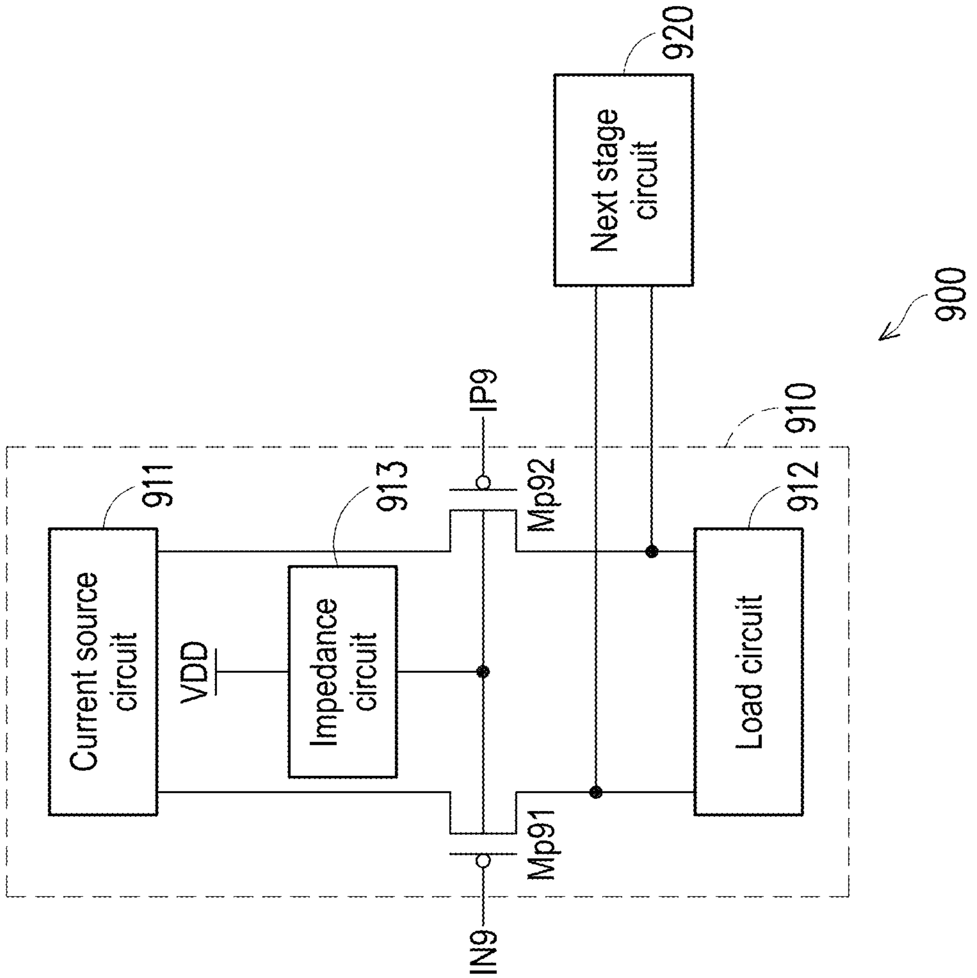
FIG. 9 is a schematic circuit block diagram of an integrated circuit according to another embodiment of the disclosure.

FIG. 9 is a schematic circuit block diagram of an integrated circuit 900 according to another embodiment of the disclosure. The integrated circuit 900 shown in FIG. 9 includes an input stage circuit 910 and a next stage circuit 920. The input stage circuit 910 includes a current source circuit 911, a load circuit 912, an input transistor Mp91, an input transistor Mp92, and an impedance circuit 913. For the integrated circuit 900, the next stage circuit 920, the input stage circuit 910, the input terminal IN9, the input terminal IP9, the current source circuit 911, the load circuit 912, the input transistor Mp91, the input transistor Mp92 and the impedance circuit 913 shown in FIG. 9, reference may be made to relevant descriptions of the integrated circuit 300, the next stage circuit 330, the input stage circuit 320, the input terminal IN3, the input terminal IP3, the current source circuit 322, the load circuit 321, the input transistor Mn31, the input transistor Mn32 and the impedance circuit 323 shown in FIG. 3 and make analogies.

A Difference from the embodiment shown in FIG. 3 is that the input transistors Mp91 and Mp92 shown in FIG. 9 are P-type metal-oxide-semiconductor (PMOS) transistors. In the embodiment shown in FIG. 9, the second terminal of the impedance circuit 323 is coupled to the first voltage, where the first voltage may be the system voltage VDD.

Figure 10:
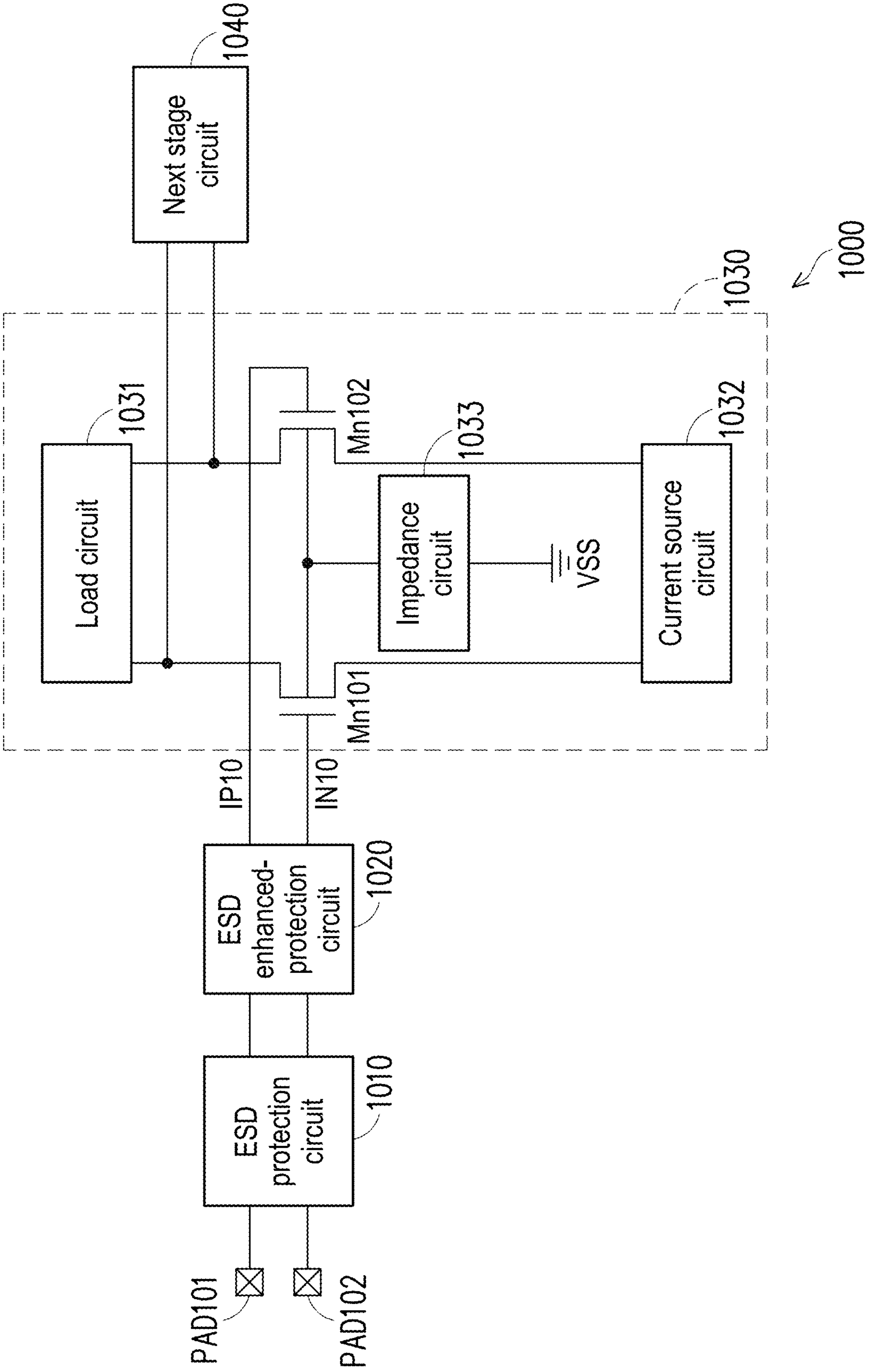
FIG. 10 is a circuit block diagram of an integrated circuit according to still another embodiment of the disclosure.

FIG. 10 is a circuit block diagram of an integrated circuit 1000 according to still another embodiment of the disclosure. The integrated circuit 1000 shown in FIG. 10 includes a signal connection pad PAD101, a signal connection pad PAD102, an ESD protection circuit 1010, an ESD enhanced-protection circuit 1020, an input stage circuit 1030 and a next stage circuit 1040. For the integrated circuit 1000, the signal connection pad PAD101, the signal connection pad PAD102, the ESD protection circuit 1010, the input stage circuit 1030, the input terminal IN10, the input terminal IP10 and the next stage circuit 1040 shown in FIG. 10, reference may be made to relevant descriptions of the integrated circuit 300, the signal connection pad PAD31, the signal connection pad PAD32, the ESD protection circuit 310, the input stage circuit 320, the input terminal IN3, the input terminal IP3 and the next stage circuit 330 shown in FIG. 3 and make analogies. The input stage circuit 1030 shown in FIG. 10 includes a load circuit 1031, a current source circuit 1032, an input transistor Mn101, an input transistor Mn102, and an impedance circuit 1033. For the load circuit 1031, the current source circuit 1032, the input transistor Mn101, the input transistor Mn102 and the impedance circuit 1033 shown in FIG. 10, reference may be made to relevant descriptions of the load circuit 321, the current source circuit 322, the input transistor Mn31, the input transistor Mn32 and the impedance circuit 323 shown in FIG. 3 and make analogies.

Different from the embodiment shown in FIG. 3, the integrated circuit 1000 shown in FIG. 10 further includes the ESD enhanced-protection circuit 1020. In the embodiment shown in FIG. 10, the ESD enhanced-protection circuit 1020 is coupled between the ESD protection circuit 1010 and the input stage circuit 1030. The ESD enhanced-protection circuit 1020 is an additional secondary ESD protection circuit. When an ESD event occurs, the ESD enhanced-protection circuit 1020 may effectively discharge the ESD charges at the input terminals IN10 and/or IP10, thereby preventing the ESD energy from damaging the control terminals (such as the gates) of the input transistors Mn101 and/or Mn102.

Figure 11:
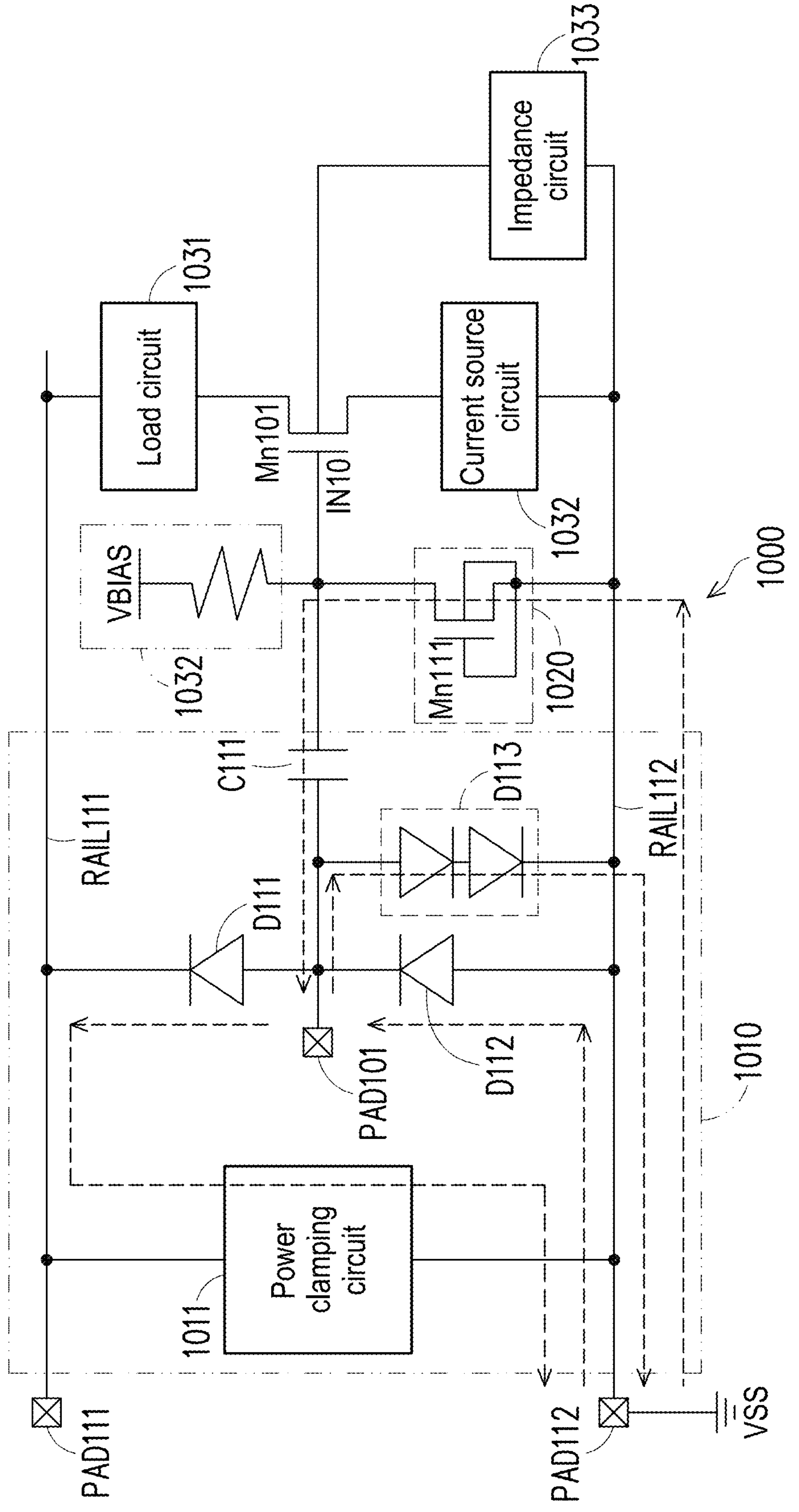
FIG. 11 is a schematic diagram illustrating a flow path of an ESD current in an integrated circuit when an ESD event occurs according to an embodiment of the disclosure.

FIG. 11 is a schematic diagram illustrating a flow path of an ESD current in the integrated circuit 1000 when an ESD event occurs according to an embodiment of the disclosure. For the integrated circuit 1000, the input transistor Mn101, the load circuit 1031, the current source circuit 1032, the impedance circuit 1033, the input terminal IN10, the signal connection pad PAD101, the ESD protection circuit 1010 and the ESD enhanced-protection circuit 1020 shown in FIG. 11, reference may be made to relevant descriptions of the integrated circuit 1000, the input transistor Mn101, the load circuit 1031, the current source circuit 1032, the impedance circuit 1033, the input terminal IN10, the signal connection pad PAD101, the ESD protection circuit 1010 and the ESD enhanced-protection circuit 1020 shown in FIG. 10. For the input transistor Mn102 and the input terminal IP10 shown in FIG. 10, reference may be made to the relevant descriptions of the input transistor Mn101 and the input terminal IN10 shown in FIG. 11 and make analogies.

FIG. 11 also illustrates one of many implementation examples of the ESD protection circuit 1010 and the ESD enhanced-protection circuit 1020 shown in FIG. 8. In the embodiment shown in FIG. 11, the ESD protection circuit 1010 includes a power clamping circuit 1011, a diode D111, a diode D112, a diode string D113, and an AC coupling capacitor C111. For a power connection pad PAD111, a power connection pad PAD112, a power rail RAIL111, a power rail RAIL112, the power clamping circuit 1011, the diode D111, the diode D112 and the AC coupling capacitor C111 shown in FIG. 11, reference may be made to the relevant descriptions of the power connection pad PAD81, the power connection pad PAD82, the power rail RAIL81, the power rail RAIL82, the power clamping circuit 311, the diode D81, the diode D82 and the AC coupling capacitor C81 shown in FIG. 8 and make analogies, and details thereof are not repeated.

In the embodiment shown in FIG. 11, the diode string D113 includes a plurality of diodes connected in series. A first terminal (for example, an anode) of the diode string D113 is coupled to the signal connection pad PAD101 and a first terminal of the AC coupling capacitor C111. A second terminal (for example, a cathode) of diode string D113 is coupled to the power rail RAIL112. In the embodiment shown in FIG. 11, the ESD enhanced-protection circuit 1020 includes an ESD protection transistor Mn111. A first terminal (for example, a drain) of the ESD protection transistor Mn111 is coupled to the ESD protection circuit 1010 and a control terminal (the input terminal IN10) of the input transistor Mn101. A second terminal and the control terminal (for example, a source and a gate) of the ESD protection transistor Mn111 are coupled to the power rail RAIL112 of the integrated circuit 1000.

It is assumed here that the power connection pad PAD112 has been coupled to the reference voltage VSS (a voltage source). When an ESD event with a negative pulse occurs on the signal connection pad PAD101, the ESD current flows from the power connection pad PAD112, and flows through the power rail RAIL112 and the diode D112 to reach the signal connection pad PAD101. In addition, the ESD current may also flow from the power connection pad PAD112, and flow through the power rail RAIL112, the ESD protection transistor Mn111 and the AC coupling capacitor C111 to reach the signal connection pad PAD101. When an ESD event with a positive pulse occurs on the signal connection pad PAD101, the ESD current flows from the signal connection pad PAD101, and flows through the diode D111, the power rail RAIL111, the power clamping circuit 1011 and the power rail RAIL112 to reach the power connection pad PAD112. In addition, the ESD current may also flow from the signal connection pad PAD101, and flow through the diode string D113 and the power rail RAIL112 to reach the power connection pad PAD112.

Compared to FIG. 2, due to the obstruction of the impedance circuit 1033 (and the isolation of the deep well), it is difficult for the ESD current to flow through the power rail RAIL112 to reach the body of the input transistor Mn101, thereby protecting the input transistor Mn101. Therefore, the impedance circuit 1033 may effectively improve the ESD tolerance of the input stage circuit 1030 without compromising the normal operating efficiency of the input stage circuit 1030.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An integrated circuit, comprising:

- a signal connection pad;
- an electrostatic discharge protection circuit, coupled to the signal connection pad;
- an input stage circuit, wherein a first input terminal of the input stage circuit is coupled to the electrostatic discharge protection circuit, and the input stage circuit comprises:
  - a load circuit;
  - a current source circuit;
  - a first input transistor, wherein a control terminal of the first input transistor is coupled to the electrostatic discharge protection circuit, a first terminal of the first input transistor is coupled to the load circuit, and a second terminal of the first input transistor is coupled to the current source circuit; and
  - an impedance circuit, wherein a first terminal of the impedance circuit is coupled to a body of the first input transistor, and a second terminal of the impedance circuit is coupled to a first voltage; and
- an electrostatic discharge enhanced-protection circuit coupled to the electrostatic discharge protection circuit and the input stage circuit, wherein the electrostatic discharge enhanced-protection circuit comprises:

an electrostatic discharge protection transistor, wherein a first terminal of the electrostatic discharge protection transistor is coupled to the electrostatic discharge protection circuit and the control terminal of the first input transistor, a second terminal and a control terminal of the electrostatic discharge protection transistor are coupled to a power rail of the integrated circuit, and the power rail is coupled to a power connection pad of the integrated circuit.

2. The integrated circuit as claimed in claim 1, wherein the input stage circuit further comprises:

a second input transistor, wherein the second input transistor and the first input transistor are an input transistor pair of the input stage circuit, a control terminal of the second input transistor serves as a second input terminal of the input stage circuit to be coupled to the electrostatic discharge protection circuit, a first terminal of the second input transistor is coupled to the load circuit, a second terminal of the second input transistor is coupled to the current source circuit, and a body of the second input transistor is coupled to the first terminal of the impedance circuit.

3. The integrated circuit as claimed in claim 1, wherein the first input transistor is an N-type transistor, the second terminal of the impedance circuit is coupled to a substrate of the integrated circuit, the substrate of the integrated circuit is coupled to the first voltage, and the first voltage is a reference voltage VSS.

4. The integrated circuit as claimed in claim 1, wherein the first input transistor is disposed in a first type well of the integrated circuit, the first type well is disposed in a second type deep well of the integrated circuit, the second type deep well is disposed in a substrate of the integrated circuit, the substrate is a first type substrate, and the second type deep well isolates the body of the first input transistor from the substrate of the integrated circuit.

5. The integrated circuit as claimed in claim 4, wherein the first type well is a P-type well, the second type deep well is an N-type deep well, the substrate is a P-type substrate, and the P-type substrate is coupled to a reference voltage VSS.

6. The integrated circuit as claimed in claim 1, wherein the load circuit comprises:

a resistor, wherein a first terminal of the resistor is coupled to a second voltage, and a second terminal of the resistor is coupled to the first terminal of the first input transistor.

7. The integrated circuit as claimed in claim 1, wherein the current source circuit comprises:

a current source, coupled to the second terminal of the first input transistor.

8. The integrated circuit as claimed in claim 1, wherein the impedance circuit comprises:

a resistor, wherein a first terminal of the resistor is coupled to the body of the first input transistor, and a second terminal of the resistor is coupled to the first voltage.

9. The integrated circuit as claimed in claim 1, wherein the impedance circuit comprises:

an inductor, wherein a first terminal of the inductor is coupled to the body of the first input transistor, and a second terminal of the inductor is coupled to the first voltage.

10. The integrated circuit as claimed in claim 1, wherein the electrostatic discharge protection circuit comprises:

a power clamping circuit, wherein a first terminal of the power clamping circuit is coupled to a first power rail of the integrated circuit, the first power rail is coupled to a first power connection pad of the integrated circuit, a second terminal of the power clamping circuit is coupled to a second power rail of the integrated circuit, and the second power rail is coupled to a second power connection pad of the integrated circuit;

a first diode, wherein a first terminal of the first diode is coupled to the signal connection pad, and a second terminal of the first diode is coupled to the second power rail; and an alternating current coupling capacitor, wherein a first terminal of the alternating current coupling capacitor is coupled to the signal connection pad and the first terminal of the first diode, and a second terminal of the alternating current coupling capacitor is coupled to the control terminal of the first input transistor.

11. The integrated circuit as claimed in claim 10, wherein the first power rail is configured to transmit a system voltage VDD, and the second power rail is configured to transmit a reference voltage VSS.

12. The integrated circuit as claimed in claim 10, wherein the electrostatic discharge protection circuit further comprises:

a second diode, wherein a first terminal of the second diode is coupled to the first power rail, and a second terminal of the second diode is coupled to the signal connection pad.

13. The integrated circuit as claimed in claim 10, wherein the electrostatic discharge protection circuit further comprises:

a diode string, comprising a plurality of diodes connected in series, wherein a first terminal of the diode string is coupled to the signal connection pad and the first terminal of the alternating current coupling capacitor, and a second terminal of the diode string is coupled to the second power rail.

14. The integrated circuit as claimed in claim 13, wherein a cathode of the first diode is coupled to the signal connection pad, an anode of the first diode is coupled to the second power rail, an anode of the diode string is coupled to the signal connection pad, and a cathode of the diode string is coupled to the second power rail.

15. The integrated circuit as claimed in claim 1, further comprising:

a bias circuit, coupled to the control terminal of the first input transistor.

* * * * *